United States Patent [19]
Ijuin

[11] Patent Number: 5,498,942
[45] Date of Patent: Mar. 12, 1996

[54] ELECTRONIC PACKAGING APPARATUS

[75] Inventor: Kenichi Ijuin, Tokyo, Japan

[73] Assignee: Sony Corporation, Tokyo, Japan

[21] Appl. No.: 251,377

[22] Filed: May 31, 1994

[30] Foreign Application Priority Data

May 31, 1993 [JP] Japan .................................. 5-129800

[51] Int. Cl.⁶ .................................................. H05K 13/04
[52] U.S. Cl. ..................... 318/567; 318/568.11; 318/578; 29/739; 29/743
[58] Field of Search .................................. 318/560, 567, 318/568.11, 568.12, 578, 626, 568.1; 29/729, 739, 740, 741, 742, 743

[56] References Cited

U.S. PATENT DOCUMENTS

| | | |
|---|---|---|
| 3,831,250 | 8/1974 | Holiday . |
| 4,231,153 | 11/1980 | Browne .................................. 29/739 |
| 5,033,185 | 7/1991 | Hidese .................................. 29/740 |

FOREIGN PATENT DOCUMENTS

| | | |
|---|---|---|
| 0325216 | 7/1989 | European Pat. Off. . |
| 0401808 | 12/1990 | European Pat. Off. . |
| 0534701 | 3/1993 | European Pat. Off. . |

*Primary Examiner*—Bentsu Ro
*Attorney, Agent, or Firm*—Ronald P. Kananen

[57] ABSTRACT

Electronic components such as chips are attracted to the tip ends of nozzles under suction, and mounted on printed-circuit boards when the vacuum condition in the nozzles is broken. The time for breaking the vacuum condition in the nozzles is adjusted by a variable time adjusting unit based on angular displacement information of a cam which vertically moves the nozzles depending on the selected mounting cycle. Even when a different mounting cycle is selected, time delays are varied to adjust the time for breaking the vacuum condition in the nozzles for thereby-mounting electronic components accurately and stably on printed-circuit boards.

14 Claims, 11 Drawing Sheets

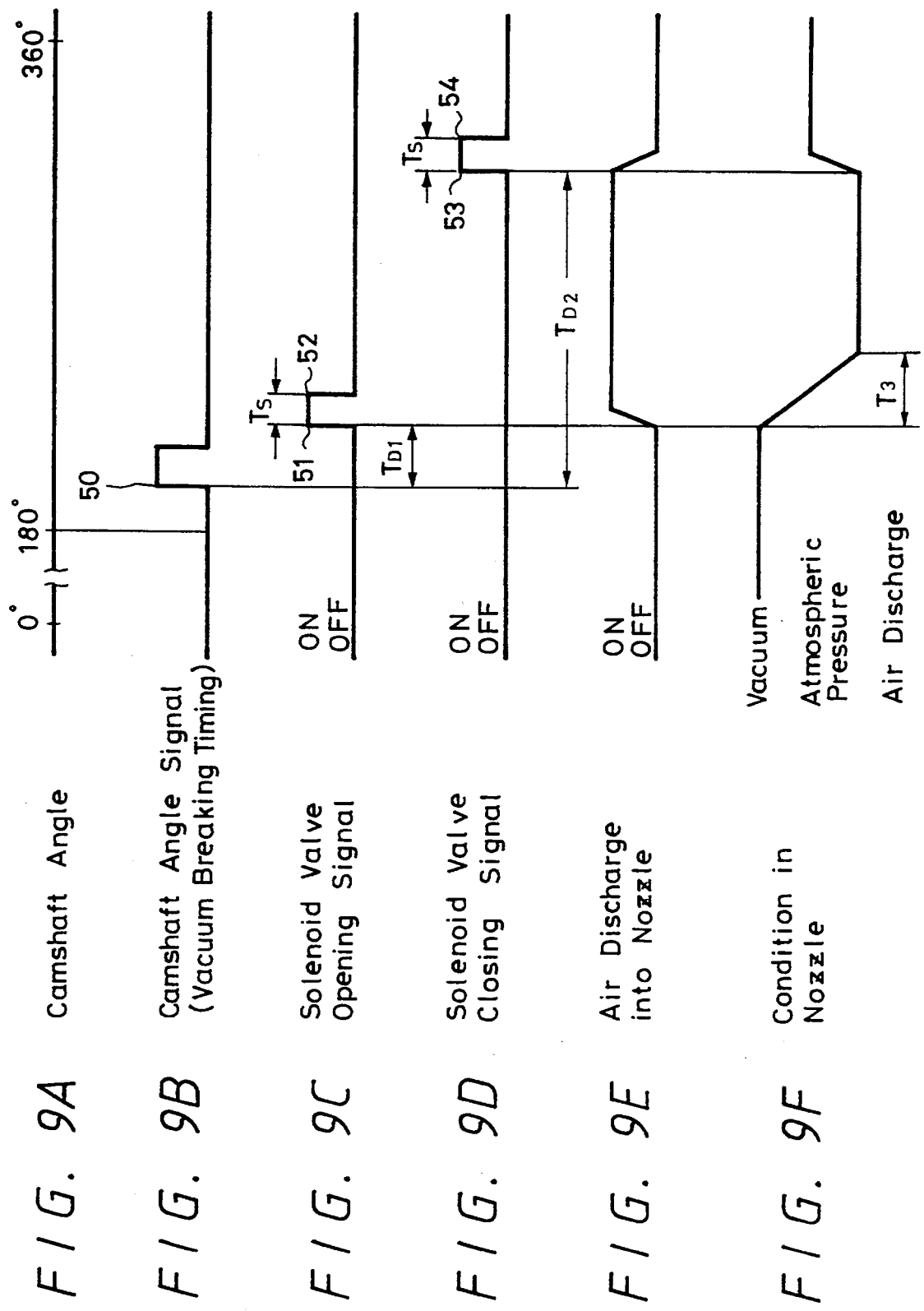

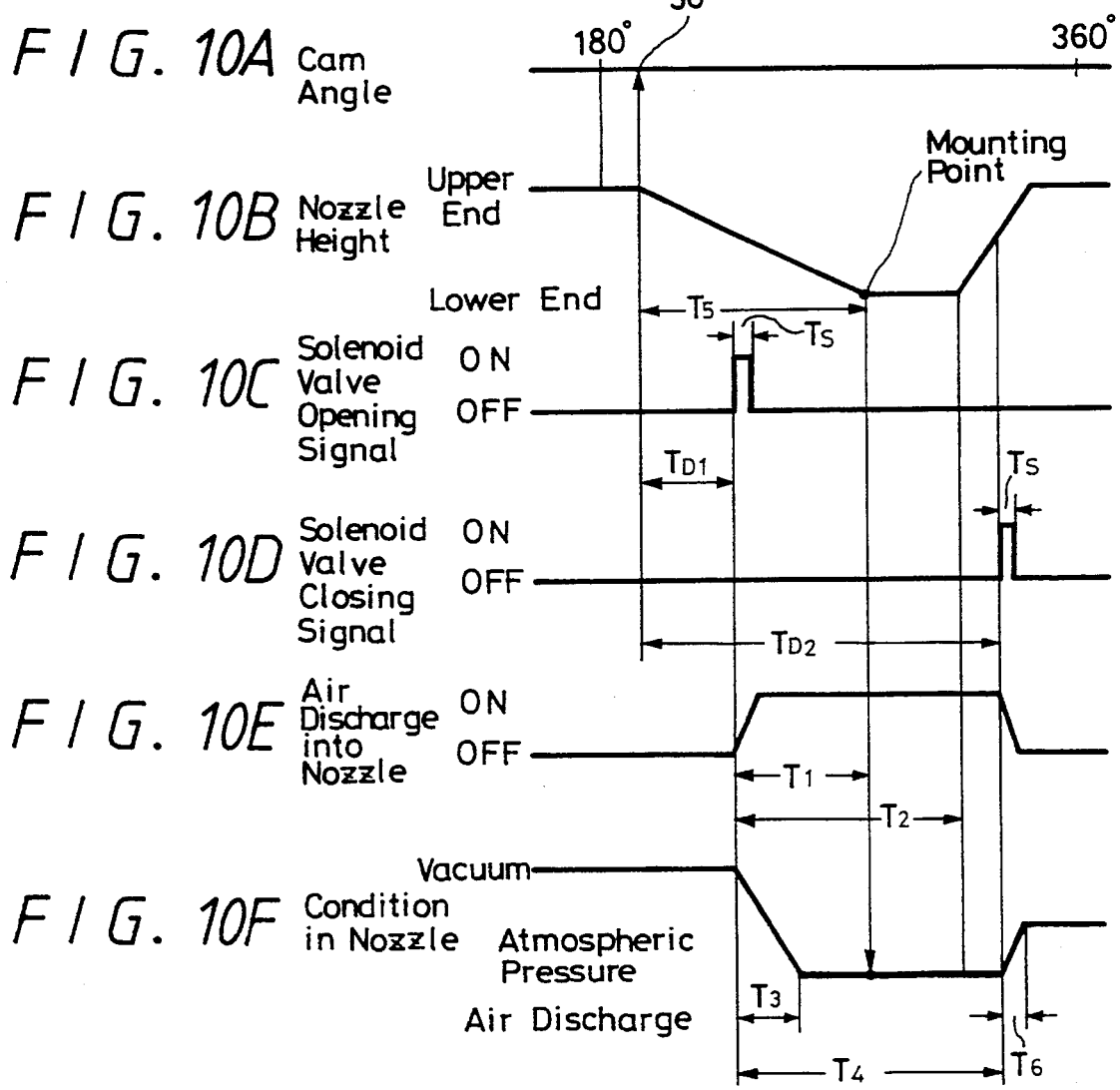

FIG. 11A Cam Angle

FIG. 11B Nozzle Height

FIG. 11C Solenoid Valve Opening Signal

FIG. 11D Solenoid Valve Closing Signal

FIG. 11E Air Discharge into Nozzle

FIG. 11F Condition in Nozzle

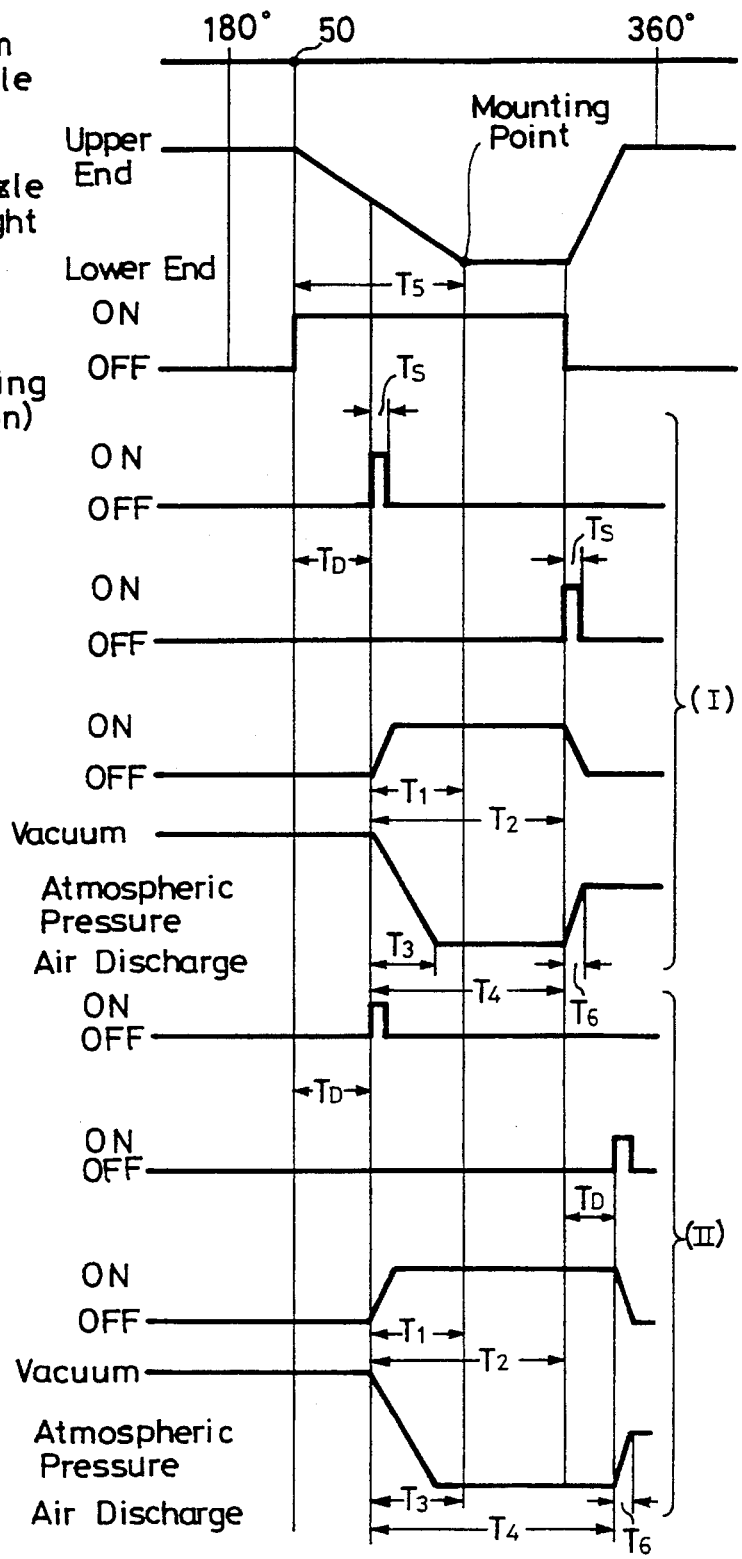
FIG. 12A Cam Angle
FIG. 12B' Nozzle Height
FIG. 12B" Vacuum Breaking Timing (Cam Angle Information)
FIG. 12C Solenoid Valve Opening Signal
FIG. 12D Solenoid Valve Closing Signal
FIG. 12E Air Discharge
FIG. 12F Condition in Nozzle
FIG. 12C' Solenoid Valve Closing Signal
FIG. 12D' Solenoid Valve Closing Signal
FIG. 12E' Air Discharge
FIG. 12F' Condition in Nozzle

ELECTRONIC PACKAGING APPARATUS

BACKGROUND OF THE INVENTION

1. Field of the Invention

The present invention relates to an electronic packaging apparatus or mounter for mounting electronic components such as chips or the like on component support mediums such as printed-circuit boards, and more particularly to an electronic packaging apparatus for moving nozzles which attract electronic components under suction with accurate timing when or after the electronic components are mounted on component support mediums.

2. Description of the Prior Art

There have heretofore been proposed various electronic packaging apparatus or mounters for mounting electronic components such as chips or the like on printed-circuit boards. FIG. 1 of the accompanying drawings schematically shows a conventional packaging machine for drawing a carrier tape with a plurality of chips bonded thereto at longitudinal intervals therealong from a cassette, and mounting chips on a printed-circuit board or the like through an attracting head on a turntable.

More specifically, as shown in FIG. 1, a component supply unit 1 movable in the directions indicated by the arrows A, A' carries a plurality of cassettes 2 each housing a roll of carrier tape with a plurality of chips bonded thereto at longitudinal intervals therealong. The component supply unit 1 is moved to bring the tape outlet port of one of the cassettes 2 to an attracting position or a first station $P_1$ on a turntable 3 which is positioned in front of the component supply unit 1.

The turntable 3 can be indexed successively to twelve positions, i.e., first through twelve stations $P_1 \sim P_{12}$, which are spaced at equal angular intervals for effective respective operations.

In the first station $P_1$, an electronic component such as a chip is attracted from a carrier tape under vacuum by an attracting head 4. Then, the turntable 3 is angularly moved an angle θ of 30° to bring the electronic component to the second station $P_2$ in which the electronic component is centered. In the next third station $P_3$, the vertical position of the electronic component is measured by a laterally positioned imaging camera or a phototransistor.

In the fourth station $P_4$, an imaging camera or the like positioned below the turntable 3 detects whether there is an electronic component or not and also recognizes the shape of the electronic component. No operation is effected on the electronic component in the fifth station $P_5$. In the sixth station $P_6$, if the electronic component is angularly displaced with respect to the attracting head 4 as detected by the shape recognition, then the electronic component is turned Δθ° into a proper angular position with respect to the attracting head 4. In the seventh station $P_7$, the electronic component attracted by the attracting head 4 is mounted on a printed-circuit board or the like.

Specifically, a component support medium such as a printed-circuit board or the like is fed onto an XY table 5 by a loading lifter 6. After the electronic component attracted by the attracting head 4 is mounted on the component support medium in the seventh station $P_7$, the component support medium is delivered from the XY table 5 onto an unloading lifter 7.

No process is carried out in the next eighth station $P_8$. The turntable 3 carries a plurality of attracting head nozzles selectable depending on the shape and size of an electronic component to be mounted. The ninth station $P_9$ checks which nozzle is being currently used.

When the checking process in the ninth station $P_9$ is finished, the type of an attracting head nozzle which will be used in a next mounting cycle has already been known. In the tenth station $P_{10}$, the nozzle to be used in the next mounting cycle is selected and brought into a front position on the turntable 3. In the eleventh station $P_{11}$, an external actuator gear is held in mesh with a gear on the selected nozzle, and turns the nozzle gear back to a predetermined angular position so that the nozzle gear will properly mesh with a gear when the nozzle attracts an electronic component. The twelfth station $P_{12}$ confirms the operation carried out in the eleventh station $P_{11}$. Then, the selected nozzle of the attracting head is turned to the attracting position in the first station $P_1$ where the attracting head attracts a next electronic component.

Each of the attracting heads 4 on the turntable 3 which are indexable successively to the above stations $P_1 \sim P_{12}$ will be described below with reference to FIGS. 2 and 3.

The attracting head 4 has a substantially cylindrical nozzle block 8, a spindle 9 mounted centrally on the nozzle block 8 for rotating the nozzle block 8 thereabout, and a gear 10 mounted on an upper surface of the nozzle block 8.

A plurality of external actuator mechanisms 11 are located respectively in some of the stations $P_1 \sim P_{11}$. For example, an external actuator mechanism 11 is positioned in the tenth station $P_{10}$, moves in the direction indicated by the arrow C (see FIG. 3) into mesh with the gear 10, and rotates the nozzle block 8 counterclockwise, for example, about the spindle 9.

The actuator mechanism 11 comprises a channel-shaped bearing 12, a drive shaft 13 rotatably mounted on the bearing 12, and a gear 14 mounted on the drive shaft 13 between upper and lower arms of the bearing 12. An actuator such as a motor (not shown) is coupled to the drive shaft 13 for rotating the drive shaft 13 clockwise, for example, about its own axis.

As shown in FIG. 2, attracting nozzles $15a$, $15b$, . . . , $15e$ having respective different nozzle diameters matching types and sizes of components to be attracted are mounted on the nozzle block 8 at equally angularly spaced five positions, respectively. Each of the nozzles $15a$, $15b$, . . . , $15e$ is rotatably supported on the nozzle block 8 by upper and lower bearings $16a$, $16b$. Gears $17a$, $17b$, . . . , $17e$ are coaxially mounted on the respective nozzles $15a$, $15b$, . . . , $15e$ above the gear 10. These gears $17a$, $17b$, . . . , $17e$ can be held in mesh with the gear 14 of the actuator mechanism 11 for rotation thereby.

To center or correct the angular position of an electronic component on the turntable 3 in the second, sixth, and eleventh stations $P_2$, $P_6$, $P_{11}$, etc., the gear 14 of the actuator mechanism 11 in each of these stations is brought into mesh with one of the gears $17a \sim 17e$ coupled respectively to the nozzles $15a \sim 15e$, and rotated to rotate the corresponding one of the nozzles $15a \sim 15e$. To select one of the nozzles in the tenth station $P_{10}$, the gear 14 of the actuator mechanism 11 in the tenth station $P_{10}$ is brought into mesh with the gear 10, and rotated to rotate the nozzle block 8.

In order to attract or release an electronic component 18 such as a chip in the first and seventh stations $P_1$, $P_7$, it is necessary to vertically move the tip end of one of the nozzles $15a \sim 15e$ to a part supply position on the turntable 3 and to vertically move the electronic component 18 attracted to the nozzle to the surface of a component support medium such as a printed-circuit board or the like, as shown in FIG. 4.

A mechanism for vertically moving the nozzles 15a–15e will be described below with reference to FIG. 4. The mechanism serves to vertically move the nozzles 15a–15e with respect to the nozzle block 8. The mechanism includes a link 27 coupled to a cam follower which is held against a cam surface of a cam 25 that is mounted on a shaft 24 rotatable by a cam drive motor 23 of a main drive assembly of the packaging machine. The link 27 converts rotary motion of the cam 25 into vertical movement of the nozzles 15a–15e in the directions indicated by the arrows D, D'. As the nozzles 15a–15e vertically move, a valve 22 disposed in each of the nozzles 15a–15e operates. The valve 22 comprises a three-way valve having a first valve port connected by a tube 21a to a vacuum pump 19 actuatable by a vacuum pump motor 20, a second valve port connected by a tube 21b and a restriction 28 to a high-pressure air inlet port 26, and a third valve port connected to one of the nozzles 15a–15e. The tip ends of the nozzles 15a–15e are open.

When each of the nozzles 15a–15e, i.e., the valve 22 disposed therein, is not pressed downwardly by the link 27, the vacuum pump 19 is actuated. If no electronic component 18 is attracted to the tip end of each of the nozzles 15a–15e, then air is drawn into the open tip end of each of the nozzles 15a–15e. If an electronic component 18 is attracted to the tip end of each of the nozzles 15a–15e, then the first valve port of the valve 22 in each of the nozzles 15a–15e is opened and the second valve port thereof is closed for developing a vacuum in each of the nozzles 15a–15e.

To attract an electronic component 18 with each of the nozzles 15a–15e and mount the electronic component 18 on a printed-circuit board 29 on the XY table 5, the valve in each of the nozzles 15a–15e is operated by the cam 25 and the link 27 to shut off the air flow toward the vacuum pump 19. Specifically, the first valve port of the valve 22 is closed, and the second valve port thereof is opened. Air under high pressure supplied from the high-pressure air inlet port 26 is restricted by the restriction 28 and then supplied through the tube 21b and the valve 22 to each of the nozzles 15a–15e, which discharge the air through their open tip ends.

The first and second valve ports of the valve 22 are selectively opened and closed in the above manner through a mechanical arrangement actuatable when the nozzles 15a–15e are pressed by the cam 25 and the link 27.

The angular displacement of the cam 27, the vertical position or height of each of the nozzles 15a–15e, the pressure in each of the nozzles 15a–15e, and the time at which the electronic component 18 is released from each of the nozzles 15a–15e are shown in FIGS. 5A through 5C. FIGS. 5A through 5C illustrate a relatively long mounting cycle.

FIG. 5A shows the angular displacement of the cam 27 and FIG. 5B shows the vertical position of each of the nozzles 15a–15e. While the cam 27 is being angularly moved from 0° to 180°+Δ°, each of the nozzles 15a–15e is in the upper end of its vertical stroke. After elapse of a time $T_5$ from the end of the period in which each of the nozzles 15a–15e is in the upper end of its vertical stroke, each of the nozzles 15a–15e reaches the lower end of its vertical stroke. When each of the nozzles 15a–15e descends to a suitable position (h) from the upper surface of the printed-circuit board 29, i.e., the lower end of its vertical stroke, the valve 22 in each of the nozzles 15a–15e is operated to start introducing air under high pressure into each of the nozzles 15a–15e. At this time, the cam 25 is angularly positioned at (A) in FIG. 5A, which position is referred to as a vacuum breaking position. The pressure in each of the nozzles 15a–15e is shown in FIG. 5C.

As shown in FIG. 5C, since the response of air is very slow, the pressure in each of the nozzles 15a–15e varies from a vacuum condition in the position (h) through an atmospheric pressure condition to an air discharge condition in a time $T_3$. When air is discharged from each of the nozzles 15a–15e after elapse of the time $T_3$, each of the nozzles 15a–15e is on its downward stroke. The pressure which is applied to the electronic component 18 upon downward movement of each of the nozzles 15a–15e is greater than the pressure applied when air is discharged. Therefore, the electronic component 18 is prevented from being ejected from the tip end of each of the nozzles 15a–15e.

After elapse of a time $T_1$ from the vacuum breaking position (A), the electronic component 18 on the tip end of each of the nozzles 15a–15e reaches the upper surface of the printed-circuit board 29. The electronic component 18 is now mounted on the printed-circuit board 29. After elapse of a time $T_2$ from the vacuum breaking position (A), each of the nozzles 15a–15e starts being elevated. At this time, air is being discharged from the open tip end of each of the nozzles 15a–15e. Thus, no force is exerted to lift the mounted electronic component 18 upon ascent of each of the nozzles 15a–15e. When each of the nozzles 15a–15e is lifted to the position (h), the valve 22 is operated to cut off the flow of the high-pressure air after elapse of a time $T_4$ from the vacuum breaking position (A). Then, the atmospheric pressure condition is developed in each of the nozzles 15a–15e in a time $T_6$ after elapse of the time $T_4$.

No problem arises if the mounting cycle is relatively long with $T_2 > T_3$ as shown in FIGS. 5A, 5B, and 5C. The mounting cycle has to be varied depending on the size and type of electronic components 18 to be held by the nozzles 15a–15e. If the mounting cycle is relatively short with $T_2 \leq T_3$, then the angular displacement of the cam 27, the vertical position of each of the nozzles 15a–15e, the pressure in each of the nozzles 15a–15e are changed for releasing the electronic component 18 from each of the nozzles 15a–15e, as shown in FIGS. 6A, 6B, and 6C.

As the mounting cycle becomes shorter, the cam 25 rotates faster. When the cam 25 is angularly moved to the vacuum breaking position (A) which is a fixed position determined by the cam 25, the valve 22 in each of the nozzles 15a–15e is operated by the link 27 to change from the vacuum condition to the air discharge condition. With the shorter mounting cycle, the times $T_1$, $T_2$ shown in FIGS. 5A–5C become shorter times $T_1'$, $T_2'$, respectively, as shown in FIGS. 6A–6C. Since the response of air is low, however, the time $T_3$ is not made shorter at the same rate as the times $T_1$, $T_2$, but remains the same ($T_3 = T_3'$).

As shown in FIGS. 6B and 6C, when the electronic component 18 attracted to each of the nozzles 15a–15e reaches a mounting point at the lower end of the downward stroke thereof after elapse of the time $T_1'$, the atmospheric pressure condition is developed in each of the nozzles 15a–15e. Even after elapse of the time $T_2'$, no air discharge condition is developed in each of the nozzles 15a–15e, and each of the nozzles 15a–15e starts ascending. Since the time $T_3'$ has not yet elapsed at this time, the electronic component 18 is not released from the tip end of each of the nozzles 15a–15e, and is lifted with each of the nozzles 15a–15e as they move upwardly. Then, the air discharge condition is developed in each of the nozzles 15a–15e on their upward movement, causing the electronic component 18 to drop onto the printed-circuit board 29. Therefore, the electronic component 18 supported by each of the nozzles 15a–15e cannot properly be mounted on the printed-circuit board 29.

Such a drawback would be eliminated by not fixing the vacuum breaking position (A) but producing a cam with a different vacuum breaking position (A) each time the mounting cycle is varied. However, if ten different mounting cycles are available to choose from, then ten different cams corresponding to the mounting cycles would have to be prepared and made available.

OBJECTS AND SUMMARY OF THE INVENTION

It is therefore an object of the present invention to provide a packaging machine capable of reliably mounting electronic components on printed-circuit boards or the like regardless of different mounting cycles which are selected.

According to the present invention, there is provided a packaging apparatus for mounting a component on a component support medium, comprising component mounting means for holding and placing a component on a component support medium in a predetermined mounting cycle, positional information detecting means for detecting drive position information of the component mounting means when or after the component is placed on the component support medium, and variable time adjusting means for adjusting a time until the component mounting means starts releasing the component or starts holding the component based on the drive position information detected by the positional information detecting means.

According to the present invention, there is also provided a packaging apparatus for mounting a component on a component support medium, comprising component mounting means for holding and placing a component on a component support medium in a predetermined mounting cycle, the component mounting means having a pneumatic pressure circuit, positional information detecting means for detecting drive position information of the component mounting means when or after the component is placed on the component support medium, variable time adjusting means for adjusting a time until the component mounting means starts releasing the component or starts holding the component based on the drive position information detected by the positional information detecting means, vacuum means for generating a vacuum condition, an air discharge passage for discharging air into the component mounting means, a three-way valve for selectively connecting the vacuum means and the air discharging means to the pneumatic pressure circuit of the component mounting means, and a solenoid valve disposed in the air discharge passage and controllable by the variable time adjusting means.

Irrespective of a component to be mounted and a mounting cycle selected, time delays are adjusted based on angular displacement information of a cam which actuates the component mounting means, for thereby achieving accurate timing to mount the component on the component support medium. Therefore, even when a different mounting cycle is selected, the component can accurately and stably be mounted on the component support medium, and the component support medium can quickly be moved away after the component has been mounted thereon.

The above and other objects, features, and advantages of the present invention will become apparent from the following description of illustrative embodiments thereof to be read in conjunction with the accompanying drawings, in which like reference numerals represent the same or similar objects.

BRIEF DESCRIPTION OF THE DRAWINGS

FIGS. 9A through 9F are timing charts illustrative of general operation of the electronic packaging apparatus according to the present invention;

FIGS. 10A through 10F are timing charts illustrative of operation of the electronic packaging apparatus according to the present invention at the time when an electronic component is to be released in a relatively long mounting cycle;

FIGS. 11A through 11F are timing charts illustrative of operation of the electronic packaging apparatus according to the present invention at the time when an electronic component is to be released in a relatively short mounting cycle; and FIGS. 12A through 12F' are timing charts illustrative of operation of an electronic packaging apparatus according to another embodiment of the present invention.

DETAILED DESCRIPTION OF THE PREFERRED EMBODIMENTS

Figure 7:
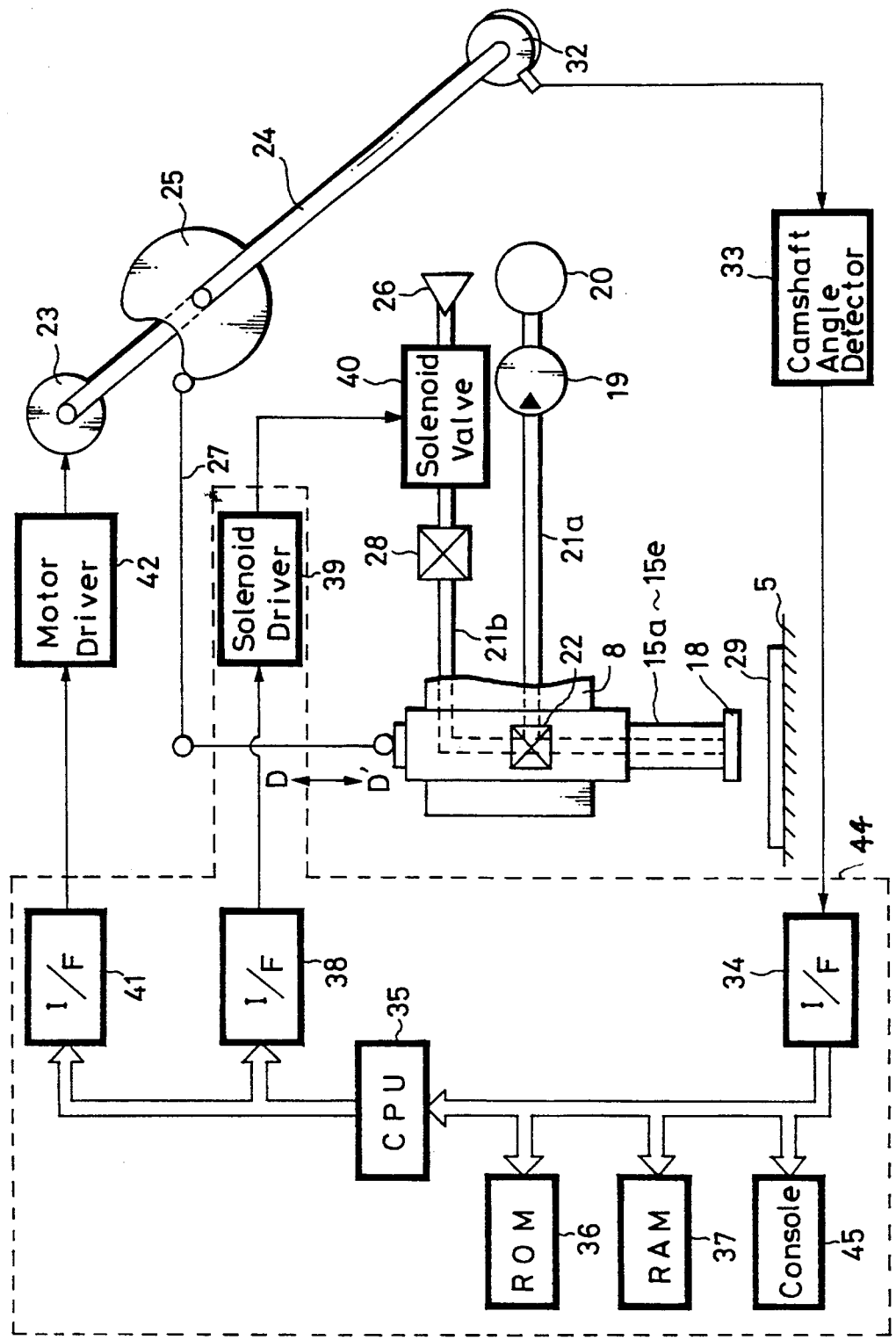
FIG. 7 is a block diagram of an electronic packaging apparatus according to an embodiment of the present invention.

FIG. 7 shows in block form an electronic packaging apparatus for mounting an electronic component 18 such as a chip on a printed-circuit board or the like according to an embodiment of the present invention. The electronic packaging apparatus shown in FIG. 7 has certain parts identical to those of the conventional electronic packaging apparatus shown in FIGS. 1 through 4, and such identical parts shown in FIG. 7 are denoted by identical reference numerals shown in FIGS. 1 through 4.

In FIG. 7, a solenoid valve 40 is connected between the high-pressure air inlet port 26 and the restriction 28 connected to each of the nozzles 15a–15e.

An encoder 32 is mounted on the shaft 24 connected to the cam 25 for electrically detecting the angular displacement of the camshaft 24 and producing a signal indicative of camshaft angular displacement information. The encoder 32 may be of any type capable of magnetically or optically detecting data composed of "1" and "0" recorded on a disk, for example. The detected angular displacement is supplied to a camshaft angle detector 33, which supplies a camshaft angle signal to a variable time adjusting unit 44. The supplied camshaft angle signal is converted by an input interface 34 in the variable time adjusting unit 44 into a digital signal that is supplied to a central processing unit (CPU) 35 in the variable time adjusting unit 44.

The variable time adjusting unit 44 also has a read-only memory (ROM) 36, a random-access memory (RAM) 37, and a console 45 such as a keyboard which are connected to the CPU 35 through a bus for exchanging data therethrough. The CPU 35 is also connected through an output interface 38 to a solenoid driver 39 for controlling the solenoid driver 39 to actuate the solenoid valve 40.

The valve 22 comprises a three-way valve having a first valve port connected by the tube 21a to the vacuum pump 19 actuatable by the vacuum pump motor 20, a second valve port connected by the tube 21b and the restriction 28 to the high-pressure air inlet port 26 through the solenoid valve 40, and a third valve port connected to each of the nozzles 15a–15e. The first valve port and the tube 21a serve as a pneumatic pressure circuit. The second valve port and the tube 21b serve as an air discharge passage. The valve 22 is mechanically actuated by the link 27 which is movable by the cam 25 for selectively developing a vacuum in each of the nozzles 15a–15e to attract an electronic component 18 such as a chip to the open tip end of each of the nozzles 15a–15e and an air discharge condition for supplying an air pressure from the high-pressure air inlet port 26 through solenoid valve 40 and the restriction 28 into each of the nozzles 15a–15e and hence discharging air under pressure from the tip end thereof thereby to release the electronic component 18.

Since the solenoid valve 40 is connected between the high-pressure air inlet port 26 and the restriction 28, when the solenoid valve 40 is open, air is supplied under pressure from the high-pressure air inlet port 26 into each of the nozzles 15a–15e, and when the solenoid valve 40 is closed, the flow of air under pressure from the high-pressure air inlet port 26 into each of the nozzles 15a–15e is cut off.

The CPU 35 in the variable time adjusting unit 44 serves as a computer for controlling the packaging apparatus in its entirety. The CPU 35 is connected through an interface 41 to a motor driver 42 which can energize the cam drive motor 23 to rotate the cam 25. When the cam drive motor 23 is energized, the rotation of the cam 25 is converted by the link 27 to vertical movement of each of the nozzles 15a–15e in the directions D, D' for mounting the electronic component 18 attracted to the tip end of each of the nozzles 15a–15e on the printed-circuit board 29.

Operation of the electronic packaging apparatus shown in FIG. 7 will be described below. An electronic component 18 such as a chip is supplied from one of the cassettes 2 of the component supply unit 1 (see FIG. 1), and attracted by one of the nozzles 15a–15e, e.g., the nozzle 15a, in the first station $P_1$. After the electronic component 18 has been adjusted and inspected in the second through sixth stations $P_2$–$P_6$, it is brought to the seventh station $P_7$. At this time, a vacuum is developed in the tube 21a and the nozzle 15a by the vacuum pump 19.

In order to install the electronic component 18 attracted to the tip end of the nozzle 15a onto the component support medium 29 such as a printed-circuit board, it is necessary to close the first valve port of the valve 22 to shut off the suction from the vacuum pump 19 and open the second valve port of the valve 22 to introduce air under pressure from the high-pressure air inlet port 26.

Such a process of mounting the electronic component 18 on the printed-circuit board 29 will be described in detail below with reference to FIGS. 8 and 9A through 9F.

Figure 8:
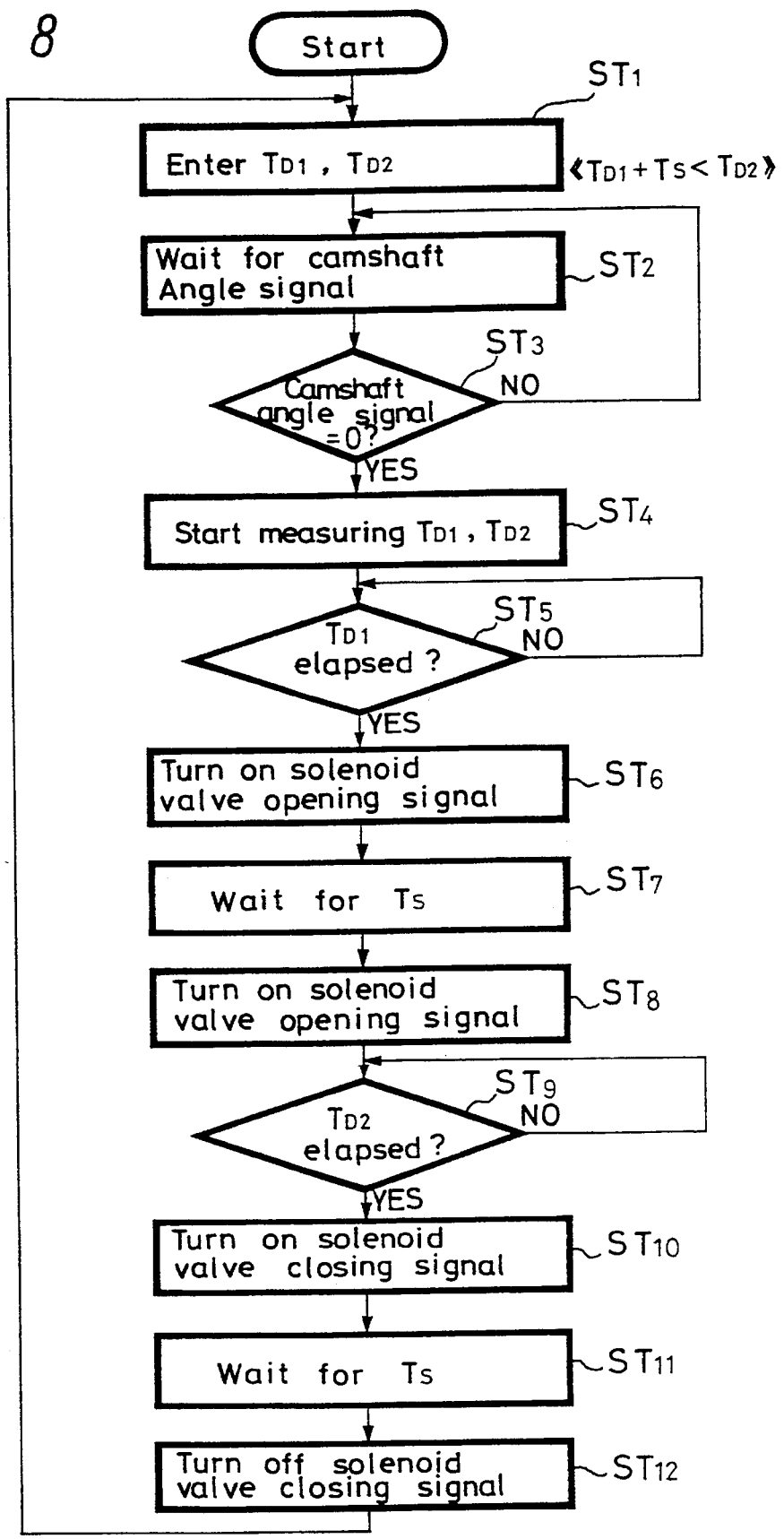
FIG. 8 is a flowchart of an operation sequence of the electronic packaging apparatus according to the invention.

The mounting cycle of the packaging apparatus has to be varied depending on the size and type of electronic components 18. When the mounting cycle is varied, the CPU 35 in the variable time adjusting unit 44 effects an operation sequence as shown in FIG. 8.

Delay times $T_{D1}$, $T_{D2}$ which are determined based on a selected mounting cycle are entered in a step $ST_1$. Specifically, the delay times $T_{D1}$, $T_{D2}$ are determined as follows:

When the vertical dimension or height from the upper to lower ends of the stroke of each of the nozzles 15a–15e is determined for the selected mounting cycle, the time $T_5$ required for the nozzle to move from the upper to lower ends of the stroke is calculated. The time $T_3$ which is consumed until an air discharge condition is developed in the valve 22 after the vacuum condition developed therein is measured per mounting cycle. The delay time $T_{D1}$ can now be determined by:

$$T_{D1}=T_5-(T_3+\alpha)$$

where $\alpha$ is a corrective value for eliminating variations inherent in different packaging apparatus. Corrective values $\alpha$ are stored in the ROMs 36 of different packaging apparatus, respectively.

Figure 1:
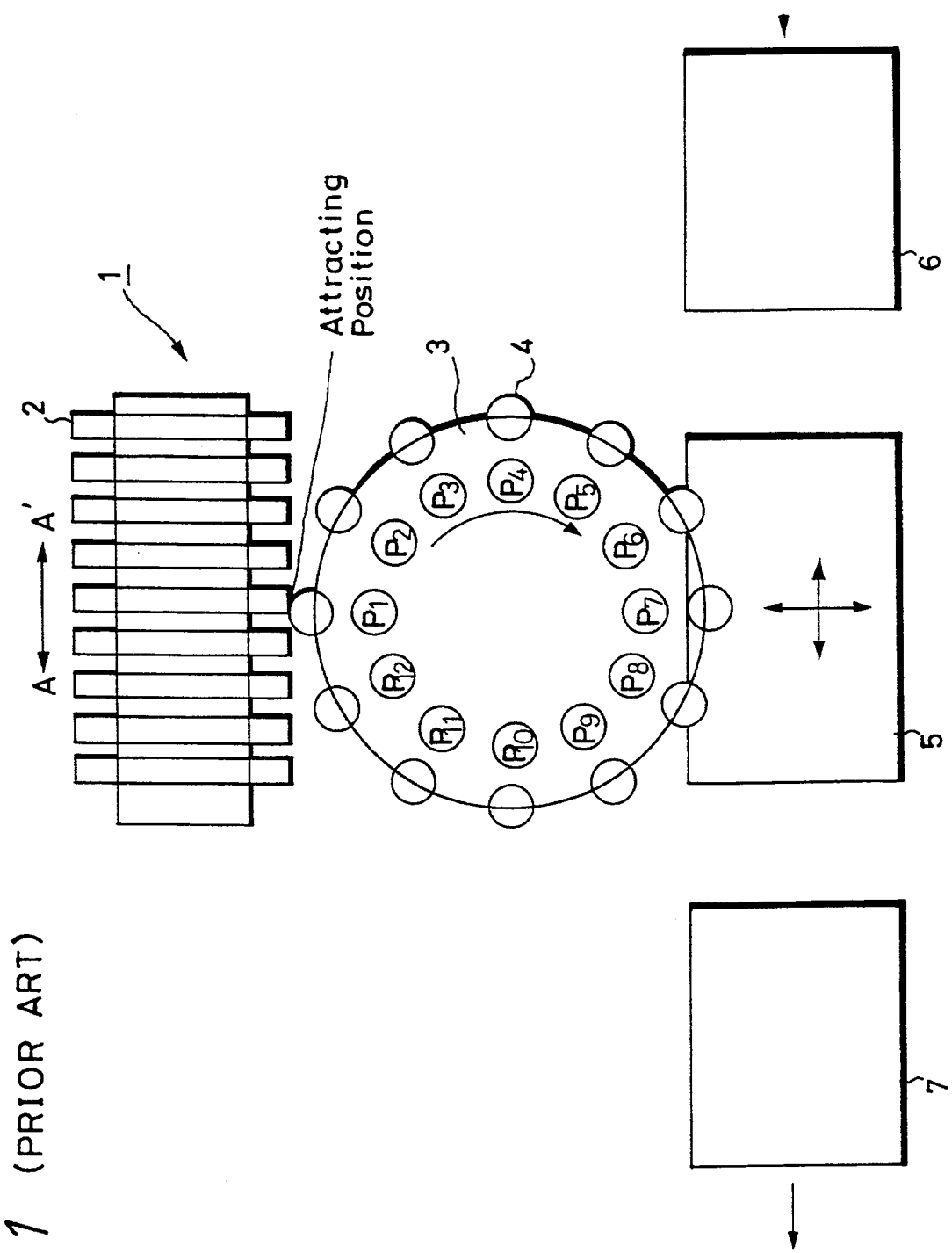
FIG. 1 is a schematic plan view of a conventional electronic packaging apparatus.
Figure 2:
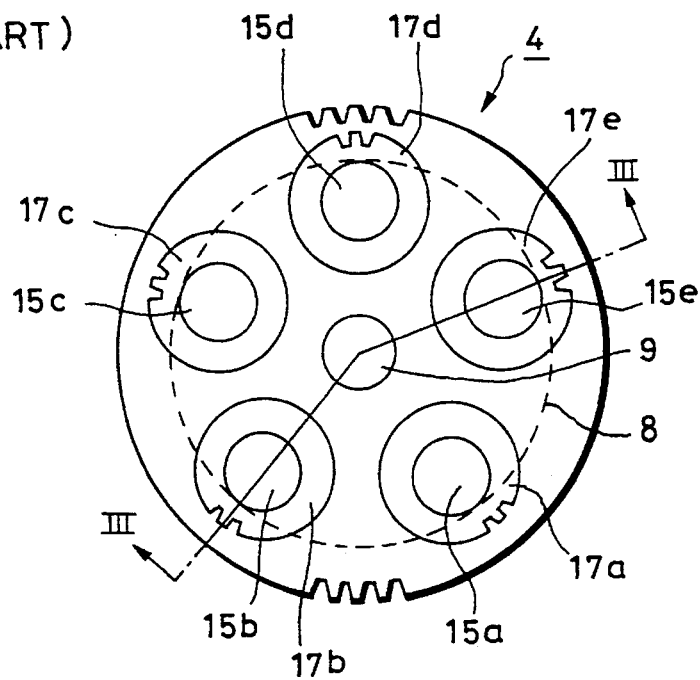
FIG. 2 is a plan view of an attracting head of the conventional electronic packaging apparatus.
Figure 3:
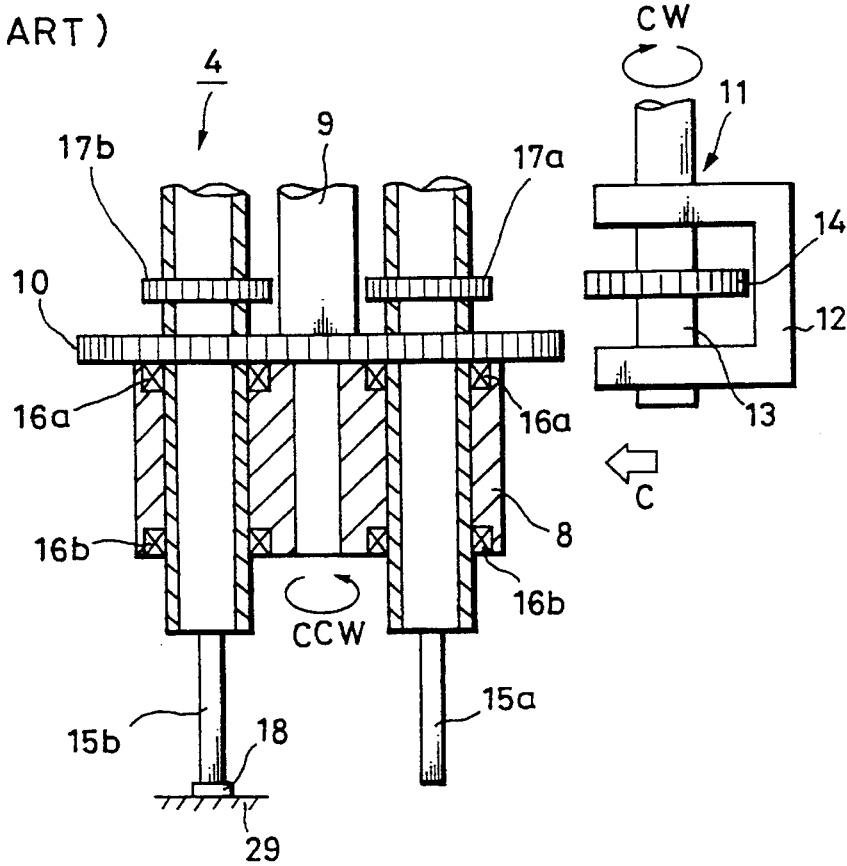
FIG. 3 is a vertical cross-sectional view of the attracting head shown in FIG. 2.
Figure 4:
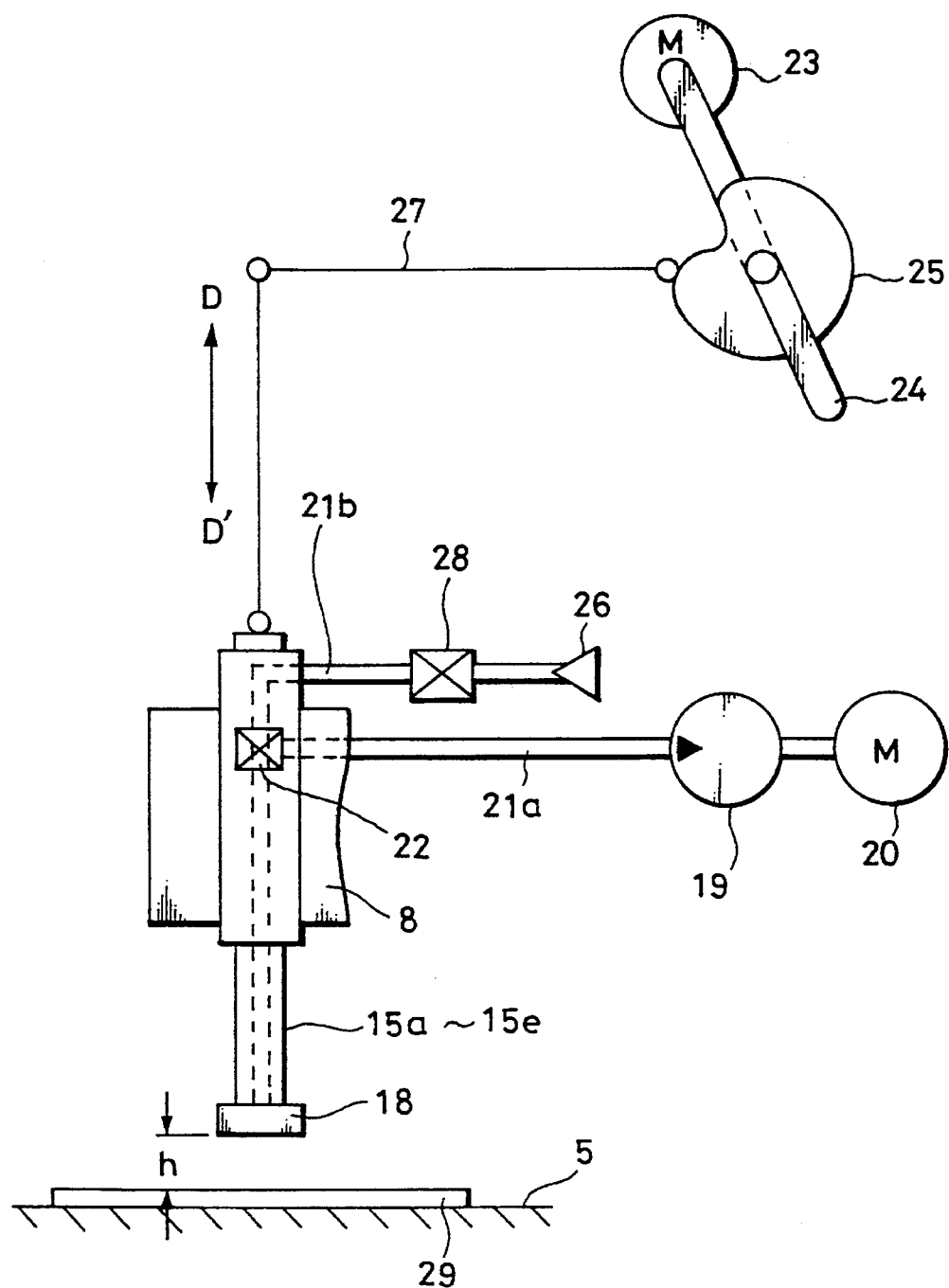
FIG. 4 is a schematic view of a mechanism for vertically moving each of nozzles on the attracting head shown in FIG. 2.
Figure 5:
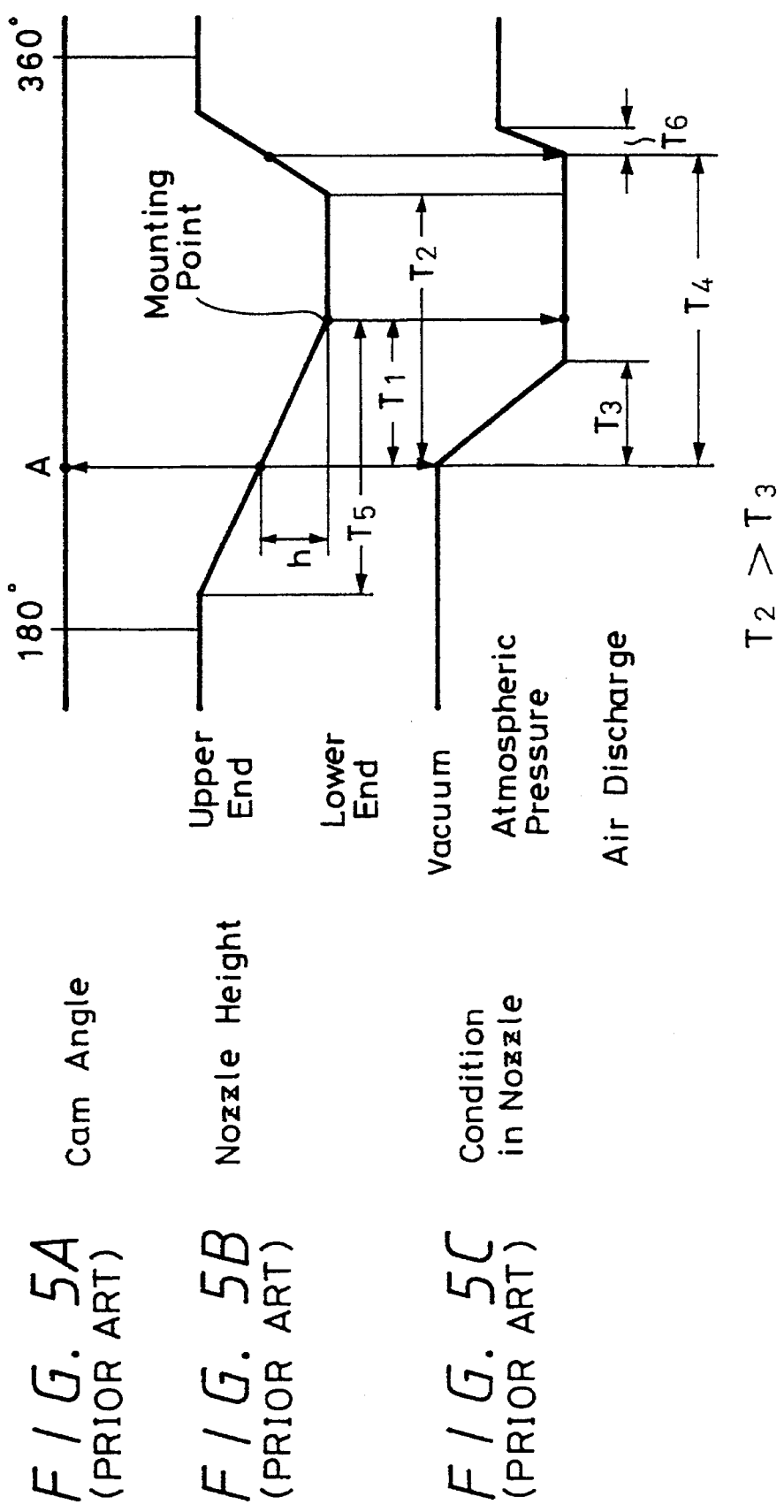
FIGS. 5A through 5C are timing charts illustrative of operation of the conventional electronic packaging apparatus at the time when an electronic component is to be released in a relatively long mounting cycle.

Once the mounting cycle is determined, the delay time $T_{D2}$ is calculated if it is fixed by the nozzle height as shown in FIG. 5B, for example.

In the step $ST_1$, the delay times $T_{D1}$, $T_{D2}$ are selected so as to satisfy the relationship: $T_{D1}+T_S<T_{D2}$ where $T_S$ is a preset minimum time required to shift the solenoid valve 40. Since the preset time $T_S$ is of a value inherent in the solenoid valve 40, it is preset in the hardware of the solenoid driver 39. It is however possible to vary the preset time $T_S$ with jumper wires or the like.

In the step $ST_1$, the entered delay times $T_{D1}$, $T_{D2}$, which are of values at the 180° position of the cam 25, for example, are stored in a memory in the CPU 35.

Until the cam 25 rotates past the 180° position and a positive-going edge of a camshaft angle signal is detected as shown in FIG. 9B, the CPU 35 waits for such a camshaft angle signal indicative of vacuum breaking timing in a step $ST_2$, and then determines whether the camshaft angle signal is turned on or not, i.e., its positive-going edge is detected or not, in a step $ST_3$. If the camshaft angle signal is turned on (YES in the step $ST_3$), then control goes to a step $ST_4$, and if the camshaft angle signal is turned off (NO in the step $ST_3$), then control goes back to the step $ST_2$.

When the camshaft angle signal is turned on, i.e., a positive-going pulse 50 thereof as shown in FIG. 9B is detected by the encoder 32 and the camshaft angle detector 33, the CPU 35 starts measuring the delay times $T_{D1}$, $T_{D2}$ stored in the memory in the step $ST_4$.

Then, the CPU 35 determines whether the delay time $T_{D1}$ has elapsed or not in a step $ST_5$. If the delay time $T_{D1}$ has elapsed (YES in the step $ST_5$), then control proceeds to a step $ST_6$. If the delay time $T_{D1}$ has not elapsed (NO in the step $ST_5$), then the CPU 35 executes the step $ST_5$ again.

In the step $ST_6$, the CPU 35 turns on a solenoid valve opening signal to apply a positive-going edge 51 (see FIG. 9C) to the solenoid coil of the solenoid valve 40 for thereby starting to open the solenoid valve 40. When the solenoid valve 40 is opened, air under pressure starts being discharged from the high-pressure air inlet port 26 into the nozzle 15a which has been in the vacuum condition. A time $T_3$ is consumed until the condition in the nozzle 15a changes from the vacuum condition through the atmospheric condition to the air discharge condition.

The CPU 35 then waits for the preset time $T_S$ to elapse in a step $ST_7$. Thereafter, the CPU 35 turns off the solenoid valve opening signal to de-energize the solenoid coil of the solenoid valve 40 in a step $ST_8$. Specifically, a negative-going edge 52 (see FIG. 9C) is applied to the solenoid coil of the solenoid valve 40, thus de-energizing the same. However, the solenoid valve 40 remains open, allowing air to be discharged into the nozzle 15a.

The CPU 35 determines whether the delay time $T_{D2}$ has elapsed or not in a step $ST_9$. If the delay time $T_{D2}$ has elapsed (YES in the step $ST_9$), then control proceeds to a step $ST_{10}$. If the delay time $T_{D2}$ has not elapsed (NO in the step $ST_9$), then the CPU 35 executes the step $ST_9$ again.

In the step $ST_{10}$, the CPU 35 turns on a solenoid valve closing signal to apply a positive-going edge 53 (see FIG. 9D) to the solenoid coil of the solenoid valve 40 for thereby starting to close the solenoid valve 40.

The CPU 35 then waits for the preset time $T_S$ to elapse in a step $ST_{11}$. Thereafter, the CPU 35 turns off the solenoid valve closing signal to de-energize the solenoid coil of the solenoid valve 40 with a negative-going edge 54 (see FIG. 9D) in a step $ST_{12}$. The condition in the nozzle 15a now returns from the air discharge condition to the atmospheric condition as shown in FIGS. 9E and 9F.

After the step $ST_{12}$, control returns to the step $ST_1$ to repeat the above sequence each time a new electronic component is to be mounted on a component support medium.

Operation of the electronic packaging apparatus according to the present invention at the time when an electronic component is to be released in relatively long and short mounting cycles will be described below with reference to FIGS. 10A through 10F and FIGS. 11A through 11F.

FIGS. 10A through 10F correspond respectively to FIGS. 9A through 9F, and FIG. 10B' corresponds to FIG. FIG. 5B. Times $T_1, T_2, T_3, T_4, T_5, T_6$ shown in FIGS. 10B', 10E, and 10F correspond to those shown in FIGS. 5B and 5C. The timing charts shown in FIGS. 10A through 10F illustrate operation of the electronic packaging apparatus when the mounting cycle is relatively long. When the mounting cycle is relatively long, the delay times $T_{D1}, T_{D2}$ are of relatively large values.

Figure 6:
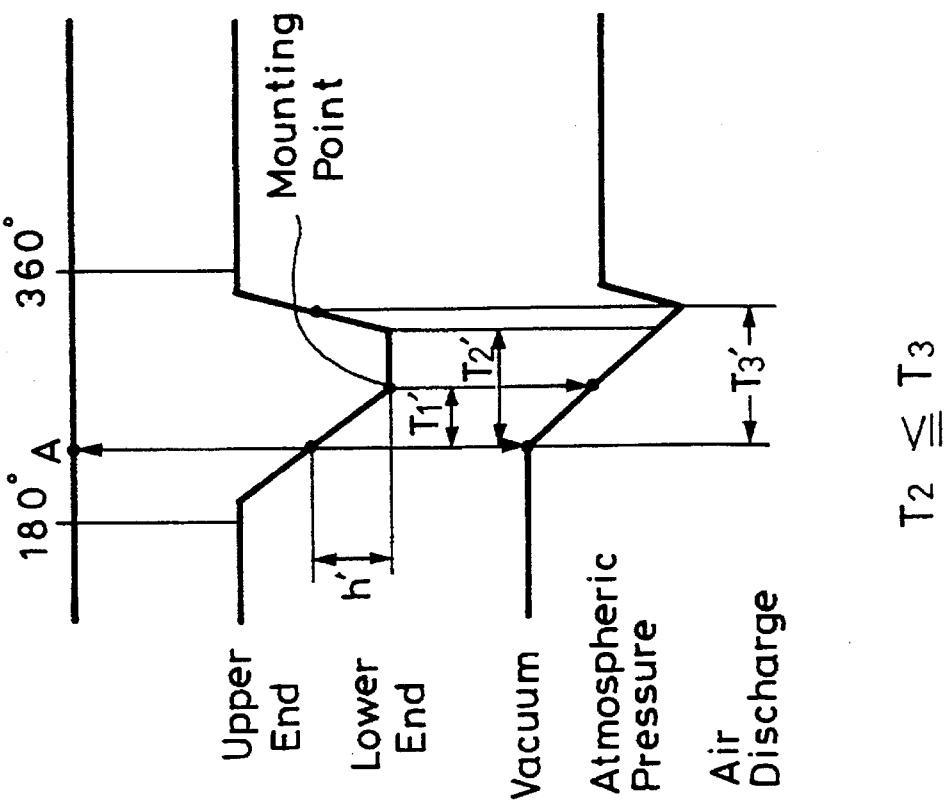
FIGS. 6A through 6C are timing charts illustrative of operation of the conventional electronic packaging apparatus at the time when an electronic component is to be released in a relatively short mounting cycle.

FIGS. 11A, 11B', 11C, 11D, 11E, and 11F correspond respectively to FIGS. 10A, 10B', 10C, 10D, 10E, and 10F, and show various times as primed. The timing charts shown in FIGS. 11A through 11F illustrate operation of the electronic packaging apparatus when the mounting cycle is relatively short and hence the delay times $T_{D1}', T_{D2}'$ are of relatively large values. The electronic packaging apparatus as it operates as shown in FIGS. 11A through 11F is free of the problems described above with reference to FIGS. 6A through 6C, can cope with a large delay as indicated by $T_3'$ due to the low response of air in the nozzles, and prevents the electronic component 18 from being lifted with each of the nozzles as each of the nozzles is lifted after it has released the electronic component 18.

In the above embodiment, the two delay times $T_{D1}, T_{D2}$ or $T_{D1}', T_{D2}'$ are employed to effect timing adjustment However, as shown in FIGS. 12A through 12F', such timing adjustment may be carried out using only one delay time $T_D$.

FIGS. 12A, 12B', 12C, 12D, 12E, and 12F correspond respectively to FIGS. 10A, 10B', 10C, 10D, 10E, and 10F, with the times indicated by identical reference characters. With the waveforms (I) shown in FIGS. 12C, 12D, 12E, and 12F, the solenoid valve opening signal (see FIG. 12C) is turned on for discharging air under pressure as shown in FIG. 12E, with a time delay $T_D$ determined for each mounting cycle, and the solenoid valve closing signal (see FIG. 12D) is turned on for shutting off the air flow based on the height of each of the nozzles 15a–15e at the lower limit as shown in FIG. 12B' or the signal indicative of the angular displacement of the cam 25 as shown in FIG. 12B".

The waveforms (II) shown in FIGS. 12C', 12D', 12E', and 12F' correspond to those shown in FIGS. 12C, 12D, 12E, and 12F. With these waveforms (II), the solenoid valve opening signal (see FIG. 12C') is turned on for discharging air under pressure as shown in FIG. 12E', with the time delay $T_D$ determined for each mounting cycle, and the solenoid valve closing signal (see FIG. 12D') is also turned on for shutting off the air flow, with the time delay $T_D$. Specifically, the solenoid valve closing signal is turned on upon elapse of the time delay $T_D$ after the signal indicative of the angular displacement of the cam 25, i.e., indicative of vacuum breaking timing, as shown in FIG. 12B" is turned off. Since the same delay time $T_D$ is used for turning on the solenoid valve opening and closing signals, only one delay time may be stored in the memory in the CPU 35.

In the illustrated embodiments, the delay times $T_{D1}, T_{D2}$ or $T_{D1}', T_{D2}'$ are employed in the process of mounting the electronic component 18 on the printed-circuit board 29. However, the delay times $T_{D1}, T_{D2}$ or $T_{D2}', T_{D2}'$ may also be employed to increase the speed at which each of the nozzles 15a–15e is lifted to allow the printed-circuit board 29 to move quickly away in a process of lifting each of the nozzles 15a–15e and changing the condition therein from the air discharge condition through the atmospheric pressure condition to the vacuum condition after the electronic component 18 has been mounted on the printed-circuit board 29.

With the arrangement of the present invention, the electronic packaging apparatus can mount electronic components highly accurately on component support mediums stably without being affected by the relationship between mounting cycles and the electronic components. The electronic packaging apparatus can also compensate for changes which are caused in the response of air due to compressibility thereof when the mounting cycle becomes shorter, for thereby effecting timing adjustment to permit high-speed mounting of electronic components on component support mediums.

Regardless of which one of different mounting cycles is selected, the hardware arrangement of the electronic packaging apparatus is not required to be changed, and various different cams are not required, but the electronic packaging apparatus is capable of flexible timing adjustment, mounting electronic components highly accurately on component support mediums, and permitting component support mediums to move quickly away after having mounted electronic components thereon.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A packaging apparatus for mounting a component on a component support medium, comprising:

component mounting means for holding and placing a component on a component support medium in a predetermined mounting cycle;

positional information detecting means for detecting drive position information of said component mounting means when or after the component is placed on the component support medium;

variable time adjusting means for adjusting a time until said component mounting means starts releasing the component or starts holding the component based on the drive position information detected by said positional information detecting means; and a camshaft for actuating said component mounting means, said drive position information comprising angular displacement information of said camshaft.

2. A packaging apparatus according to claim 1, wherein said component mounting means comprises an attracting head including a pneumatic pressure circuit, said time until said component mounting means starts releasing the component being a time until a condition in said pneumatic pressure circuit starts switching from a vacuum condition to an air discharge condition after said drive position information is received.

3. A packaging apparatus according to claim 1, wherein said component mounting means comprises an attracting head including a pneumatic pressure circuit, said time until said component mounting means starts releasing the component being a time until a condition in said pneumatic pressure circuit starts switching from an air discharge condition to a vacuum condition after said drive position information is received.

4. A packaging apparatus according to claim 1, wherein said variable time adjusting means comprises a computer including a memory.

5. A packaging apparatus according to claim 1, wherein said camshaft actuates said component mounting means vertically and linearly.

6. A packaging apparatus for mounting a component on a component support medium, comprising:

component mounting means for holding and placing a component on a component support medium in a predetermined mounting cycle, said component mounting means having a pneumatic pressure circuit;

positional information detecting means for detecting drive position information of said component mounting means when or after the component is placed on the component support medium;

variable time adjusting means for adjusting a time until said component mounting means starts releasing the component or starts holding the component based on the drive position information detected by said positional information detecting means;

vacuum means for generating a vacuum condition;

an air discharge passage for discharging air into said component mounting means;

a three-way valve for selectively connecting said vacuum means and said air discharge passage to said pneumatic pressure circuit of said component mounting means;

a solenoid valve disposed in said air discharge passage and controllable by said variable time adjusting means; and a camshaft for actuating said component mounting means, said drive position information comprising angular displacement information of said camshaft.

7. A packaging apparatus according to claim 6, wherein said camshaft actuates said component mounting means vertically and linearly.

8. A packaging apparatus for mounting a component on a component support medium, comprising:

component mounter for holding and placing a component on a component support medium in a predetermined mounting cycle;

positional information detector for detecting drive position information of said component mounter when or after the component is placed on the component support medium;

variable time adjuster for adjusting a time until said component mounter starts releasing the component or starts holding the component based on the drive position information detected by said positional information detector; and a camshaft for actuating said component mounter, said drive position information comprising angular displacement information of said camshaft.

9. A packaging apparatus according to claim 8, wherein said component mounter comprises an attracting head including a pneumatic pressure circuit, said time until said component mounter starts releasing the component being a time until a condition in said pneumatic pressure circuit starts switching from a vacuum condition to an air discharge condition after said drive position information is received.

10. A packaging apparatus according to claim 8, wherein said component mounter comprises an attracting head including a pneumatic pressure circuit, said time until said component mounter starts releasing the component being a time until a condition in said pneumatic pressure circuit starts switching from an air discharge condition to a vacuum condition after said drive position information is received.

11. A packaging apparatus according to claim 8, wherein said variable time adjuster comprises a computer including a memory.

12. A packaging apparatus according to claim 8, wherein said camshaft actuates said component mounter vertically and linearly.

13. A packaging apparatus for mounting a component on a component support medium, comprising:

a component mounter for holding and placing a component on a component support medium in a predetermined mounting cycle, said component mounter having a pneumatic pressure circuit;

a positional information detector for detecting drive position information of said component mounter when or after the component is placed on the component support medium;

a variable time adjuster for adjusting a time until said component mounter starts releasing the component or starts holding the component based on the drive position information detected by said positional information detector;

a vacuum generator for generating a vacuum condition;

an air discharge passage for discharging air into said component mounter;

a three-way valve for selectively connecting said vacuum generator and said air discharge passage to said pneumatic pressure circuit of said component mounter;

a solenoid valve disposed in said air discharge passage and controllable by said variable time adjuster; and a camshaft for actuating said component mounter, said drive position information comprising angular displacement information of said camshaft.

14. A packaging apparatus according to claim 13, wherein said camshaft actuates said component mounter vertically and linearly.

* * * * *